(12) United States Patent
Fukumitsu et al.

(10) Patent No.: US 11,757,425 B2
(45) Date of Patent: Sep. 12, 2023

(54) RESONANCE DEVICE AND METHOD FOR PRODUCING RESONANCE DEVICE

(71) Applicant: Murata Manufacturing Co., Ltd., Nagaokakyo (JP)

(72) Inventors: Masakazu Fukumitsu, Nagaokakyo (JP); Kentarou Dehara, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 778 days.

(21) Appl. No.: 16/884,401

(22) Filed: May 27, 2020

(65) Prior Publication Data
US 2020/0295732 A1 Sep. 17, 2020

Related U.S. Application Data

(63) Continuation of application No. PCT/JP2018/034266, filed on Sep. 14, 2018.

(30) Foreign Application Priority Data

Feb. 14, 2018 (JP) .................. 2018-023946

(51) Int. Cl.
*H03H 9/10* (2006.01)
*B81B 7/00* (2006.01)
(Continued)

(52) U.S. Cl.
CPC ......... *H03H 9/1057* (2013.01); *B81B 7/0038* (2013.01); *B81C 1/00285* (2013.01);
(Continued)

(58) Field of Classification Search
CPC .. H03H 3/0072; H03H 9/1057; H03H 9/2457; H03H 3/02; B81B 7/0038;
(Continued)

(56) References Cited

U.S. PATENT DOCUMENTS 7,605,521 B2 10/2009 Kuwahara
3,003,193 A1 8/2011 Hata et al.
(Continued)

FOREIGN PATENT DOCUMENTS

JP 2003174056 A 6/2003
JP 2005191923 A 7/2005
(Continued)

OTHER PUBLICATIONS

International Search Report Issued for PCT/JP2018/034266, dated Nov. 20, 2018.
(Continued)

*Primary Examiner* — Alexander A Singh
(74) *Attorney, Agent, or Firm* — ArentFox Schiff LLP

(57) ABSTRACT

A resonance device that includes a MEMS substrate including a resonator, an upper cover, and a bonding portion that bonds the MEMS substrate to the upper cover to seal a vibration space of the resonator. The bonding portion includes a eutectic layer composed of a eutectic alloy of germanium and a metal mainly containing aluminum, a first titanium (Ti) layer, a first aluminum oxide film, and a first conductive layer consecutively arranged from the MEMS substrate to the upper cover.

20 Claims, 10 Drawing Sheets

(51) Int. Cl.
*B81C 1/00* (2006.01)
*H03H 3/007* (2006.01)
*H03H 9/24* (2006.01)

(52) U.S. Cl.
CPC ........ *H03H 3/0072* (2013.01); *H03H 9/2457* (2013.01); *B81B 2201/0271* (2013.01); *B81C 2203/0118* (2013.01)

(58) Field of Classification Search
CPC ........ B81B 2201/0271; B81C 1/00285; B81C 2203/0118; B81C 1/00269; H02N 2/186; H02N 2/188
USPC ........................................................ 310/309
See application file for complete search history.

(56) References Cited

U.S. PATENT DOCUMENTS

| | | | |
|---|---|---|---|
| 9,263,763 | B2 | 2/2016 | Hirayama et al. |
| 2007/0170819 | A1 | 7/2007 | Kuwahara |
| 2008/0233349 | A1 | 9/2008 | Hata et al. |
| 2014/0363745 | A1 | 12/2014 | Hirayama et al. |
| 2017/0252855 | A1 | 9/2017 | Fukumitsu et al. |
| 2018/0048286 | A1* | 2/2018 | Goto ...................... H03H 9/172 |
| 2019/0089321 | A1* | 3/2019 | Morinaga ............ H03H 3/0077 |

FOREIGN PATENT DOCUMENTS

| | | |
|---|---|---|
| JP | 2007184859 A | 7/2007 |
| JP | 2008105162 A | 5/2008 |
| JP | 2013149599 A | 8/2013 |

OTHER PUBLICATIONS

Written Opinion of the International Searching Authority issued for PCT/JP2018/034266, dated Nov. 20, 2018.

\* cited by examiner

FIG. 2
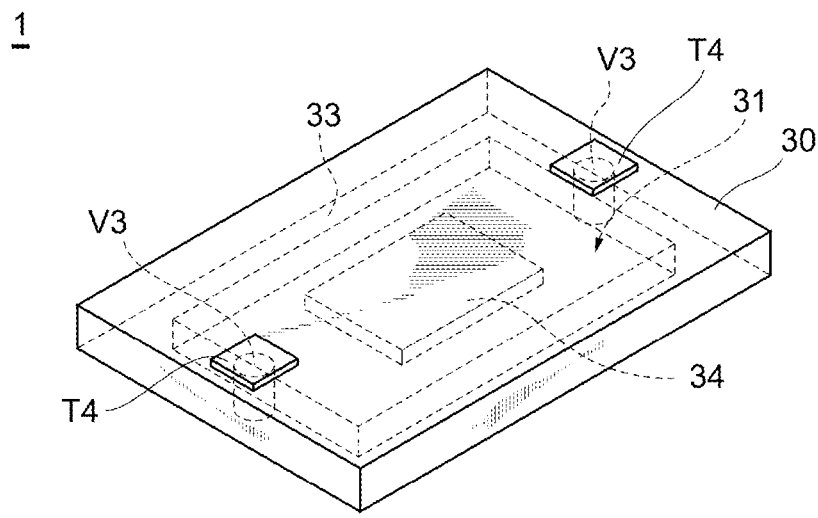
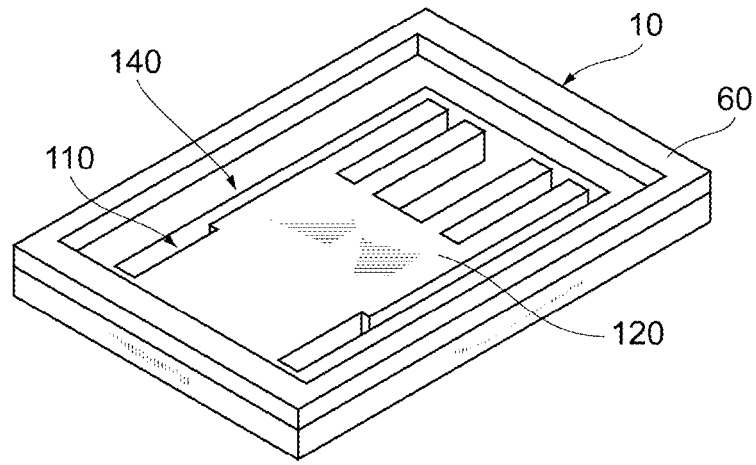
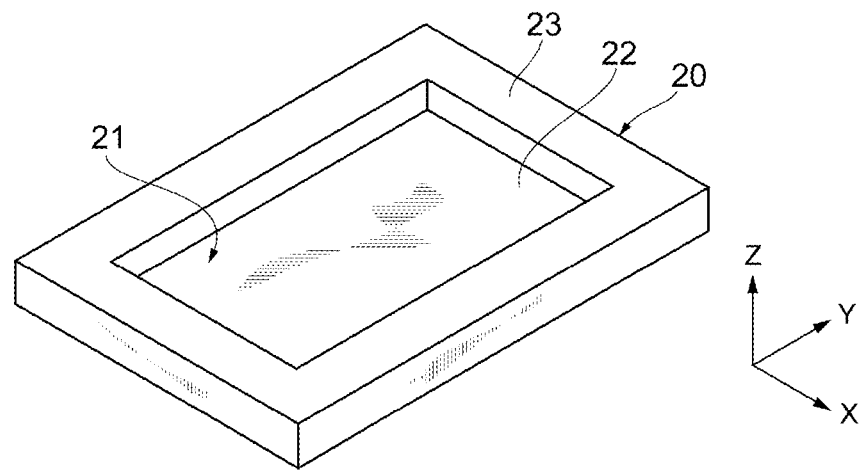

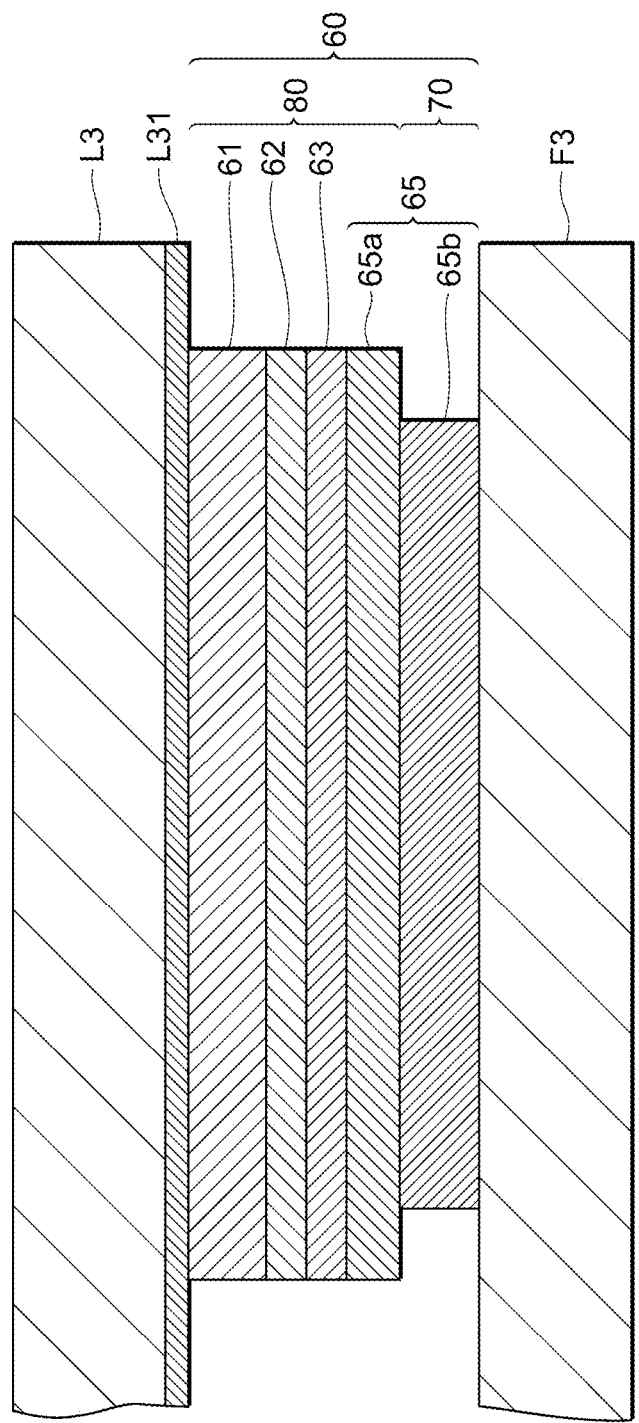

RESONANCE DEVICE AND METHOD FOR PRODUCING RESONANCE DEVICE

CROSS REFERENCE TO RELATED APPLICATIONS

The present application is a continuation of International application No. PCT/JP2018/034266, filed Sep. 14, 2018, which claims priority to Japanese Patent Application No. 2018-023946, filed Feb. 14, 2018, the entire contents of each of which are incorporated herein by reference.

FIELD OF THE INVENTION

The present invention relates to a resonance device and a method for producing a resonance device.

BACKGROUND OF THE INVENTION

Hitherto, resonance devices produced by microelectromechanical systems (MEMS) technology have been widely used. Such a resonance device is produced, for example, by bonding an upper substrate to a lower substrate that includes a resonator.

Patent Document 1 discloses a bonding portion including a diffusion preventing layer that is stacked above a wafer and that is composed of a material having low wettability with AuSn, a bonding layer that is disposed on a surface of the diffusion preventing layer and that is spaced apart from edges of the diffusion preventing layer, and a functional layer that is disposed between the wafer and the diffusion preventing layer and that is easily degraded by the diffusion of AuSn. In the bonding portion, since the bonding layer is spaced apart from edges of the diffusion preventing layer, when AuSn eutectic bonding is performed with AuSn solder, molten AuSn solder does not easily spread over the surface of the diffusion preventing layer; thus, the flowing down of the solder to the functional layer due to the diffusion of AuSn is less likely to occur.

PTL 1: Japanese Unexamined Patent Application Publication No. 2013-149599

SUMMARY OF THE INVENTION

A vibration space in which a resonator vibrates in a resonance device needs to be hermetically sealed to maintain a vacuum state in order to stabilize the resonance characteristics of the resonator. Outgassing from a material of the resonance device causes a decrease in the degree of vacuum in the vibration space. To prevent the occurrence of the outgassing, a method for performing degassing by heat treatment in the production of a resonance device has been used.

However, in a bonding portion bonded by eutectic bonding, when heat treatment for degassing is performed at a high temperature, thermal diffusion occurs easily to cause, for example, the deviation of a eutectic composition and the failure of a eutectic reaction during eutectic bonding. Thus, the heat treatment for degassing cannot be performed at a high temperature, and the degree of vacuum in the vibration space of the resonator may be decreased by outgassing.

The present invention has been accomplished in view of the foregoing circumstances. It is an object of the present invention to provide a resonance device that can maintain the vibration space of a resonator in a high vacuum and a method for producing a resonance device.

A resonance device according to an aspect of the present invention includes a first substrate including a resonator, a second substrate, and a bonding portion bonding the first substrate to the second substrate so as to seal a vibration space of the resonator. The bonding portion includes a eutectic layer composed of a eutectic alloy of germanium and a metal mainly containing aluminum, a first titanium layer, a first aluminum oxide film, and a first conductive layer consecutively arranged from the first substrate to the second substrate lies.

A method for producing a resonance device according to another aspect of the present invention includes forming a first layer including a metal layer mainly containing aluminum around a vibrating portion of a resonator of a first substrate, forming a second layer on a portion of a second substrate that faces the first layer when the first substrate faces the second substrate, the second layer including a first conductive layer, a first aluminum oxide film, a first titanium layer, and a germanium layer consecutively formed in this order from the second substrate, and bonding the metal layer of the first layer to the germanium layer of the second layer by eutectic bonding so as to seal a vibration space of the resonator.

According to the present invention, the vibration space of the resonator can be maintained in a high vacuum.

BRIEF DESCRIPTION OF THE DRAWINGS

FIG. 2 is a schematic exploded perspective view of the structure of a resonance device according to an embodiment of the present invention.

FIG. 5 is a schematic enlarged fragmentary cross-sectional view of a bonding portion illustrated in FIG. 4.

DETAILED DESCRIPTION OF THE PREFERRED EMBODIMENTS

Figure 1:
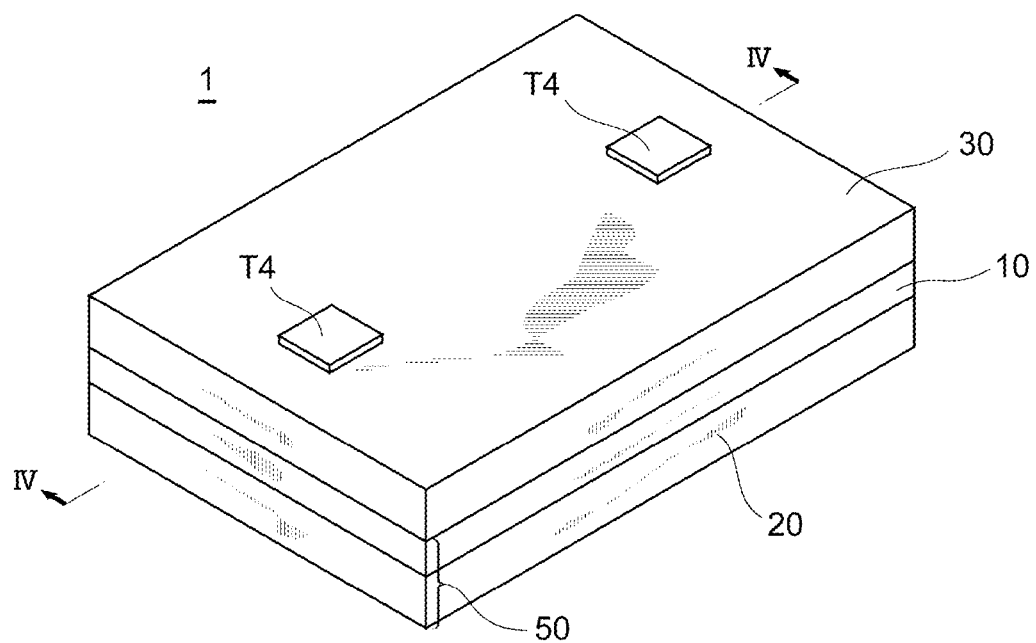
FIG. 1 is a schematic perspective view of the appearance of a resonance device according to an embodiment of the present invention.

Embodiments of the present invention will be described below. In the following description of the drawings, the same or similar components are denoted by the same or similar reference numerals. It is noted that the drawings are illustrative only and the dimensions and geometries are schematic only, and the technical scope of the present invention should not be understood as being limited to the embodiments.

EMBODIMENTS

The schematic structure of a resonance device 1 according to an embodiment of the present invention will be described with reference to FIGS. 1 and 2. FIG. 1 is a schematic perspective view of the appearance of the resonance device 1 according to an embodiment of the present invention. FIG. 2 is a schematic exploded perspective view of the structure of the resonance device 1 according to an embodiment of the present invention.

The resonance device 1 includes a lower cover 20, a resonator 10 (hereinafter, the lower cover 20 and the resonator 10 are also collectively referred to as a "MEMS substrate 50"), an upper cover 30, and a bonding portion 60. That is, the resonance device 1 includes the MEMS substrate 50, the bonding portion 60, and the upper cover 30 stacked in this order. The MEMS substrate 50 corresponds to an example of a "first substrate" in the present description. The upper cover 30 corresponds to an example of a "second substrate" in the present description.

Each component of the resonance device 1 will be described below. In the following description, a side of the resonance device 1 on which the upper cover 30 lies will be described as an upper side (or front), and a side of the resonance device 1 on which the lower cover 20 lies will be described as a lower side (or back).

The resonator 10 is a MEMS vibrator produced by MEMS technology. The resonator 10 and the upper cover 30 are bonded with the bonding portion 60, described below, provided therebetween. The resonator 10 and the lower cover 20 each include a silicon (Si) substrate (hereinafter, referred to as a "Si substrate"), and these Si substrates are bonded together. The MEMS substrate 50 (the resonator 10 and the lower cover 20) may include an SOI substrate.

The upper cover 30 extends in a flat plate shape along the XY plane and includes, for example, a recessed portion 31 having a flat rectangular parallelepiped shape on the back side thereof. The recessed portion 31 is surrounded by a side wall 33 and included as part of a vibration space in which the resonator 10 vibrates. A gettering layer 34 is disposed on a surface of the recessed portion 31 of the upper cover 30 adjacent to the resonator 10. The upper cover 30 need not include the recessed portion 31 and may have a flat plate structure.

Two terminals T4 are disposed on a surface of the upper cover 30. Through vias V3 filled with a conductive material are disposed below the respective terminals T4. The terminals T4 are electrically connected to respective voltage application portions 141 on a holding portion 140 described below.

The lower cover 20 includes a rectangular flat base plate 22 disposed along the XY plane and a side wall 23 extending from the outer edge portion of the base plate 22 in the Z-axis direction, i.e., in the stacking direction of the lower cover 20 and the resonator 10. The lower cover 20 includes a recessed portion 21 on a surface thereof facing the resonator 10, the recessed portion 21 being defined by a surface of the base plate 22 and the inner surface of the side wall 23. The recessed portion 21 is included as part of the vibration space of the resonator 10. The lower cover 20 need not include the recessed portion 21 and may have a flat plate structure. A gettering layer may also be disposed on a surface of the recessed portion 21 of the lower cover 20 adjacent to the resonator 10.

Figure 3:
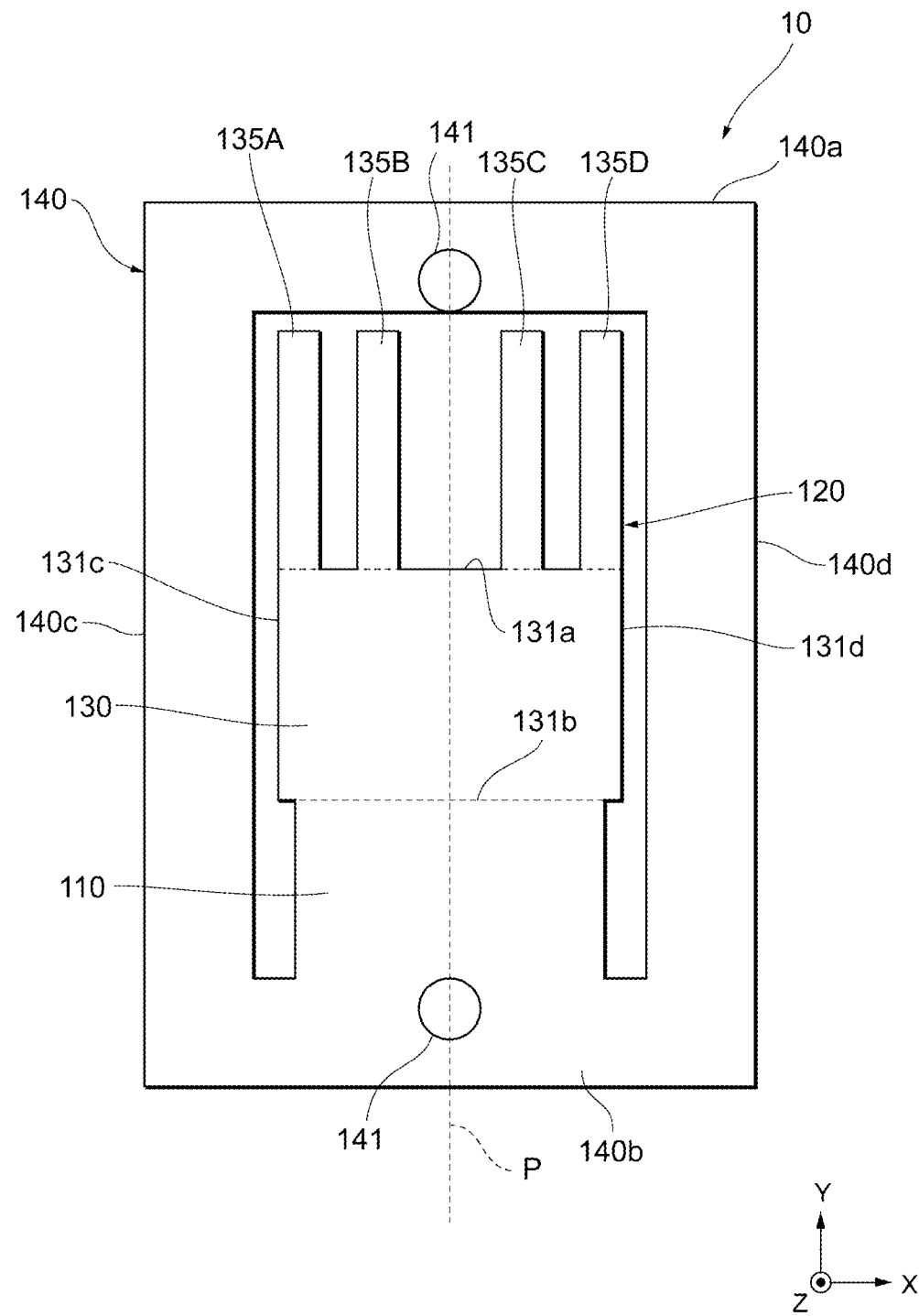
FIG. 3 is a plan view of the structure of a resonator according to an embodiment of the present invention.

The schematic structure of the resonator 10 according to a first embodiment of the present invention will be described below with reference to FIG. 3. FIG. 3 is a schematic plan view of the structure of the resonator 10 according to an embodiment of the present invention.

As illustrated in FIG. 3, the resonator 10 is a MEMS vibrator produced by MEMS technology and vibrates in an out-of-plane mode in the XY plane of a rectangular coordinate system in FIG. 3. The resonator 10 is not limited to a resonator used in an out-of-plane flexural vibration mode. For example, the resonator of the resonance device 1 may be used in an extensional vibration mode, a thickness longitudinal vibration mode, a Lamb wave vibration mode, an in-plane flexural vibration mode, or a surface acoustic wave vibration mode. These vibrators may be used for, for example, timing devices, RF filters, duplexers, ultrasonic transducers, gyro sensors, and acceleration sensors. Additionally, these vibrators may be used for, for example, piezoelectric mirrors having actuator functions, piezoelectric gyros, piezoelectric microphones having pressure sensor functions, or ultrasonic vibration sensors. Furthermore, these vibrators may be used for electrostatic MEMS devices, electromagnetically driven MEMS devices, or piezoresistive MEMS devices.

The resonator 10 includes a vibrating portion 120, the holding portion 140, and a holding arm 110.

The vibrating portion 120 is disposed inside the holding portion 140. A space is formed between the vibrating portion 120 and the holding portion 140 at a predetermined spacing. In the example illustrated in FIG. 3, the vibrating portion 120 includes a base portion 130 and four vibrating arms 135A to 135D (hereinafter, also collectively referred to as "vibrating arms 135"). The number of vibrating arms is not limited to four, and is set to, for example, any number equal to or more than one. In this embodiment, the vibrating arms 135A to 135D and the base portion 130 are integrally formed.

The base portion 130 has long sides 131a and 131b in the X-axis direction and short sides 131c and 131d in the Y-axis direction when viewed in the plan view of FIG. 3. The long side 131a is a side of the front-end face (hereinafter, also referred to as a "front end 131A") of the base portion 130. The long side 131b is a side of the back-end face (hereinafter, also referred to as a "back end 131B") of the base portion 130. In the base portion 130, the front end 131A and the back end 131B are disposed so as to be opposite each other.

The base portion 130 is connected to the vibrating arms 135 at the front end 131A and is connected to the holding arm 110 described below at the back end 131B. In the example illustrated in FIG. 3, the shape of the base portion 130 is, but not limited to, a substantially rectangular shape when viewed in plan. The base portion 130 may be disposed so as to be substantially symmetric with respect to a virtual plane P specified along the perpendicular bisector of the long side 131a. For example, the base portion 130 may have a trapezoidal shape in which the long side 131b is shorter than the long side 131a or may have a semicircular shape having a diameter defined by the long side 131a. Each of the faces of the base portion 130 is not limited to a flat face, and may be a curved face. The virtual plane P is a plane extending through the center of the vibrating portion 120 in the direction in which the vibrating arms 135 are arranged.

In the base portion 130, the base-portion length, which is the longest distance between the front end 131A and the back end 131B, in a direction from the front end 131A toward the back end 131B is about 35 μm. The base-portion width, which is the longest distance between the side edges of the base portion 130, in the width direction perpendicular to the direction of the base-portion length is about 265 μm.

The vibrating arms 135 extend in the Y-axis direction and have the same size. Each of the vibrating arms 135 is disposed between the base portion 130 and the holding portion 140 in parallel with the Y-axis direction. One end of each vibrating arm 135 is a fixed end connected to the front end 131A of the base portion 130, and the other end is an open end. The vibrating arms 135 are arranged in parallel at predetermined intervals in the X-axis direction. Each of the vibrating arms 135 has, for example, a width of about 50 μm in the X-axis direction and a length of about 465 μm in the Y-axis direction.

The holding portion 140 has a rectangular frame shape surrounding the outer side portion of the vibrating portion 120 along the XY plane. For example, the holding portion 140 is integrally formed from a prismatic frame. The holding portion 140 may be at least partially disposed around the vibrating portion 120 and is not limited to the frame shape.

The voltage application portions 141 are disposed in a region of the holding portion 140 facing the open ends of the vibrating arms 135 and in a region connected to the holding arm. The voltage application portions 141 are electrically connected to the terminals T4 of the upper cover 30 and can apply an alternating electric field to the resonator 10.

The holding arm 110 is disposed inside the holding portion 140 and connects the vibrating portion 120 to the holding portion 140.

The stacked structure of the resonance device 1 according to the first embodiment of the present invention will be described below with reference to FIG. 4, which is a schematic cross-sectional view of the resonance device 1 taken along line IV-IV of FIG. 1.

Figure 4:
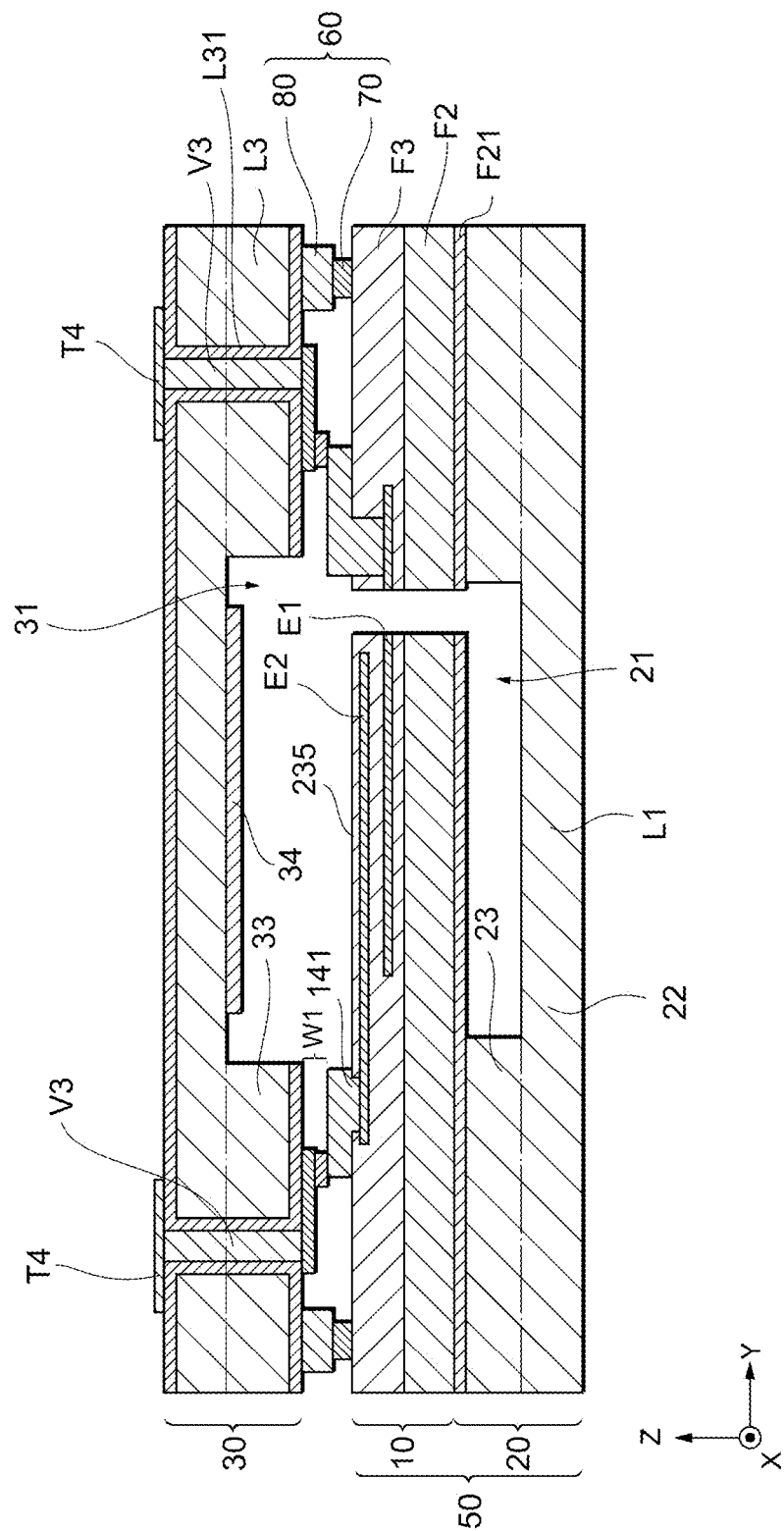
FIG. 4 is a schematic cross-sectional view of the resonance device taken along line IV-IV of FIG. 1.

As illustrated in FIG. 4, in the resonance device 1, the holding portion 140 of the resonator 10 is bonded to the side wall 23 of the lower cover 20, and the holding portion 140 of the resonator 10 is bonded to the side wall 33 of the upper cover 30. The resonator 10 is held between the lower cover 20 and the upper cover 30. The lower cover 20, the upper cover 30, and the holding portion 140 of the resonator 10 define the vibration space in which the vibrating arms 135 vibrate.

The upper cover 30 is formed of a silicon (Si) wafer (hereinafter, referred to as a "Si wafer") L3 having a predetermined thickness. The peripheral portion (side wall 33) of the upper cover 30 is bonded to the holding portion 140 of the resonator 10 by the bonding portion 60 described below. The front surface of the upper cover 30 facing the resonator 10, the back surface thereof, and side faces of the through vias V3 are preferably covered with a silicon oxide film L31. The silicon oxide film L31 is formed on surfaces of the Si wafer L3 by, for example, oxidation of the Si wafer L3 or chemical vapor deposition (CVD).

The gettering layer 34 is disposed on a surface of the recessed portion 31 of the upper cover 30 facing the resonator 10. The gettering layer 34 is composed of, for example, titanium (Ti) and adsorbs a gas generated in the vibration space. In the upper cover 30 according to this embodiment, the gettering layer 34 is disposed on almost the entire surface of the recessed portion 31 facing the resonator 10; thus, a decrease in the degree of vacuum in the vibration space can be suppressed.

The through vias V3 in the upper cover 30 are formed by filling through holes in the upper cover 30 with a metal such as polycrystalline silicon (poly-Si). The through vias V3 function as lines that electrically connect the terminals T4 to the voltage application portions 141. Connecting lines W1 are disposed between the through vias V3 and the voltage application portions 141. The connecting lines W1 are formed by, for example, eutectic bonding between an aluminum (Al) film and a germanium (Ge) film.

The base plate 22 and the side wall 23 of the lower cover 20 are integrally formed of a Si wafer L1. The upper surface of the side wall 23 of the lower cover 20 is bonded to the holding portion 140 of the resonator 10. The thickness of the lower cover 20 defined in the Z-axis direction is, for example, 150 μm. The depth of the recessed portion 21 is, for example, 50 μm. The Si wafer L1 is composed of non-degenerate silicon and has a resistivity of, for example, 16 mΩ·cm or more.

The holding portion 140, the base portion 130, the vibrating arms 135, and the holding arm 110 of the resonator 10 are integrally formed by the same process. In the resonator 10, a piezoelectric thin film F3 is disposed on a Si substrate F2, which is an example of a substrate, so as to cover the Si substrate F2. A metal layer E1 is stacked on the piezoelectric thin film F3. A piezoelectric thin film F3 is stacked on the metal layer E1 so as to cover the metal layer E1. A metal layer E2 is stacked on the piezoelectric thin film F3. A protective film 235 is stacked on the metal layer E2 so as to cover the metal layer E2.

The Si substrate F2 is composed of, for example, a degenerate n-type Si semiconductor having a thickness of about 6 μm and can contain, for example, phosphorus (P), arsenic (As), or antimony (Sb) as an n-type dopant. The degenerate Si used for the Si substrate F2 has a resistance of, for example, less than 16 mΩ·cm, preferably 1.2 mΩ·cm or less. A silicon oxide (for example, $SiO_2$) layer F21 serving as an example of a temperature characteristic correction layer is disposed on the lower surface of the Si substrate F2. This enables an improvement in temperature characteristics. The silicon oxide layer F21 may be disposed on the upper surface of the Si substrate F2 or may be disposed on each of the upper surface and the lower surface of the Si substrate F2.

Each of the metal layers E1 and E2 is formed by using, for example, molybdenum (Mo) or aluminum (Al) having a thickness of, for example, about 0.1 μm to about 0.2 μm.

Each of the metal layers E1 and E2 is formed into a desired shape by, for example, etching. For example, the metal layer E1 is formed so as to function as a lower electrode on the vibrating portion 120. Additionally, the metal layer E1 is formed so as to, on the holding arm 110 and the holding portion 140, function as a line that connects the lower electrode to an alternating-current power supply disposed outside the resonator 10.

The metal layer E2 is formed so as to function as an upper electrode on the vibrating portion 120.

Additionally, the metal layer E2 is formed so as to, on the holding arm 110 and the holding portion 140, function as a line that connects the upper electrode to a circuit disposed outside the resonator 10.

The protective film 235 is formed of a nitride film composed of, for example, aluminum nitride (AlN) or silicon nitride (SiN) or an oxide film composed of, for example, tantalum pentoxide ($Ta_2O_5$) or silicon dioxide ($SiO_2$). A portion of the protective film 235 on the holding portion 140 is removed so as to expose the metal layer E2. A portion where the protective film 235 is removed is filled with a metal, such as aluminum (Al), to form the voltage application portion 141.

The piezoelectric thin film F3 is a piezoelectric thin film that converts an applied voltage into vibration and can be mainly composed of, for example, aluminum nitride (AlN) or an oxide. Specifically, the piezoelectric thin film F3 can be composed of scandium aluminum nitride (ScAlN). Scandium aluminum nitride is a compound in which aluminum in aluminum nitride is partially replaced with scandium. The piezoelectric thin film F3 has a thickness of, for example, 1 μm and may have a thickness of about 0.2 μm to about 2 μm.

The piezoelectric thin film F3 expands and contracts in the in-plane direction of the XY plane, i.e., in the Y-axis direction, in accordance with an electric field applied from the metal layers E1 and E2 to the piezoelectric thin film F3. Due to the expansion and contraction of the piezoelectric thin film F3, the vibrating arms 135 displace their free ends toward the inner surfaces of the lower cover 20 and the upper cover 30 and vibrate in an out-of-plane flexural vibration mode.

In this embodiment, the phase of an electric field applied to the outer vibrating arms 135A and 135D and the phase of an electric field applied to the inner vibrating arms 135B and 135C are set to be opposite to each other. Accordingly, the outer vibrating arms 135A and 135D and the inner vibrating arms 135B and 135C are displaced in opposite directions. For example, when the outer vibrating arms 135A and 135D displace their free ends toward the inner surface of the upper cover 30, the inner vibrating arms 135B and 135C displace their free ends toward the inner surface of the lower cover 20.

The bonding portion 60 is disposed in a rectangular ring shape along the XY plane between the MEMS substrate 50 (the resonator 10 and the lower cover 20) and the upper cover 30 around the vibrating portion 120 of the resonator 10, for example, on the holding portion 140. The bonding portion 60 bonds the MEMS substrate 50 and the upper cover 30 so as to seal the vibration space of the resonator 10. This hermetically seals the vibration space to maintain a vacuum state.

In this embodiment, the bonding portion 60 includes a first layer 70 disposed on the MEMS substrate 50 and a second layer 80 disposed on the upper cover 30. The MEMS substrate 50 and the upper cover 30 are bonded by eutectic bonding between the first layer 70 and the second layer 80.

The stacked structure of the bonding portion 60 according to the first embodiment of the present invention will be described below with reference to FIG. 5. FIG. 5 is a schematic enlarged fragmentary cross-sectional view of the structure of the bonding portion 60 illustrated in FIG. 4.

As illustrated in FIG. 5, the bonding portion 60 includes a eutectic layer 65, a first titanium (Ti) layer 63, a first aluminum oxide film 62, and a first conductive layer 61 consecutively arranged from the MEMS substrate 50 (the resonator 10 and the lower cover 20) to the upper cover 30.

The eutectic layer 65 includes a germanium (Ge) layer 65a and a metal layer 65b mainly containing aluminum. In an example illustrated in FIG. 5, each of the germanium (Ge) layer 65a and the metal layer 65b is illustrated as an independent layer. In fact, however, the interface therebetween is formed by eutectic bonding. In other words, the eutectic layer 65 is composed of a eutectic alloy of germanium (Ge) and a metal mainly containing aluminum (Al). As used herein, the term "mainly containing" means the most abundant component of that article, and not necessarily more than 50% of the article. For example, "a metal mainly containing aluminum" could mean that more than 50% of that metal is aluminum, or aluminum is less than 50% or that metal but is the most abundant component of that metal.

The material of the metal layer 65b is preferably aluminum (Al), an aluminum-copper alloy (AlCu alloy), or an aluminum-silicon-copper alloy (AlSiCu alloy). Aluminum or an aluminum alloy is a metal that is often used for, for example, lines in resonance devices and so forth. In the case where aluminum (Al), an aluminum-copper alloy (AlCu alloy), or an aluminum-silicon-copper alloy (AlSiCu alloy) is used for the metal layer 65b, the germanium (Ge) layer 65a and the metal layer 65b can be easily bonded together by eutectic bonding, the production process can be simplified, and the bonding portion 60 that seals the vibration space of the resonator 10 can be easily formed.

The metal layer 65b of the bonding portion 60 is included in the first layer 70. The first conductive layer 61, the first aluminum oxide film 62, the first titanium (Ti) layer 63, and the germanium (Ge) layer 65a are included in the second layer 80.

The first conductive layer 61 is disposed on a surface of the silicon oxide film L31 on the back surface side of the upper cover 30. The material of the first conductive layer 61 is preferably aluminum (Al), an aluminum-copper alloy (AlCu alloy), or an aluminum-silicon-copper alloy (AlSiCu alloy). When the first conductive layer 61 is composed of an aluminum-copper alloy (AlCu alloy), copper (Cu) is preferably contained in an amount of about 0.5% by weight. In this case, the first conductive layer 61 is electrically conductive, the production process can be simplified, and the bonding portion 60 that seals the vibration space of the resonator 10 can be easily formed.

The first aluminum oxide film 62 is disposed on the first conductive layer 61 (below the first conductive layer 61 in FIG. 5). The first aluminum oxide film 62 is composed of aluminum oxide. The first aluminum oxide film 62 is formed on the first conductive layer 61 by exposing a surface of the first conductive layer 61 to an oxygen plasma or air. When the surface of the first conductive layer 61 is exposed to air, the first aluminum oxide film 62 having a thickness of about 5 nm is formed. The first aluminum oxide film 62 preferably has a thickness of 3 nm to 10 nm. In this case, it is possible to suppress an increase in resistance to conduction due to the first aluminum oxide film 62.

The first titanium (Ti) layer 63 is disposed on the first aluminum oxide film 62 (below the first aluminum oxide film 62 in FIG. 5). The first titanium (Ti) layer 63 is composed of titanium (Ti). The first titanium (Ti) layer 63 functions as a close-contact layer for providing close contact between the eutectic layer 65 and the first titanium (Ti) layer 63. Titanium (Ti) has excellent wettability with a eutectic alloy of germanium (Ge) and a metal mainly containing aluminum (Al) obtained by eutectic bonding. Since the bonding portion 60 includes the eutectic layer 65 and the first titanium (Ti) layer 63 disposed consecutively, the eutectic layer 65 can spread over the first titanium (Ti) layer 63 to suppress the possible formation of voids between the eutectic layer 65 and the first titanium (Ti) layer 63. Accordingly, the airtightness of the vibration space of the resonator 10 can be enhanced.

Titanium (Ti) has the feature that the material cost is low, compared with, for example, tantalum (Ta) and tantalum nitride (TaN). Since the bonding portion 60 includes the first titanium (Ti) layer 63, it is possible to reduce the production cost of the bonding portion 60.

The first aluminum oxide film 62 and the first titanium (Ti) layer 63 function as diffusion-preventing layers for preventing thermal diffusion. Here, thermal diffusion is less likely to occur between the aluminum oxide film and the titanium (Ti) than between, for example, aluminum (Al) and titanium (Ti).

To verify the function as the diffusion-preventing layers, the upper cover 30 on which the second layer 80 including the first conductive layer 61, the first aluminum oxide film 62, the first titanium (Ti) layer 63, and the germanium (Ge) layer 65a was disposed was subjected to heat treatment for degassing at 435° C. The results indicated that in the second layer 80 after the heat treatment, no migration of aluminum or an aluminum alloy of the first conductive layer 61 due to thermal diffusion was observed.

For comparison with the second layer 80 according to this embodiment, a second layer that does not contain the first aluminum oxide film 62, specifically, an upper cover on which a virtual second layer including a conductive layer composed of aluminum (Al), a titanium (Ti) layer, and a germanium (Ge) layer were consecutively arranged in this order, was subjected to heat treatment for degassing at 360° C. In the virtual second layer after the heat treatment, aluminum (Al) in the conductive layer diffused to the germanium (Ge) layer through the titanium (Ti) layer. This thermal diffusion causes a deviation of a eutectic composition and the failure of a eutectic reaction during eutectic bonding.

As described above, since the bonding portion 60 includes the first titanium (Ti) layer 63 and the first aluminum oxide film 62 consecutively arranged, the thermal diffusion between the aluminum oxide film and titanium (Ti) is less likely to occur; thus, it is possible to raise the temperature of the heat treatment for degassing. Accordingly, a gas contained in the resonance device 1 can be released (evaporated) by high-temperature heat treatment to suppress the occurrence of outgassing, thereby providing a high vacuum in the vibration space of the resonator 10.

Figure 6A:
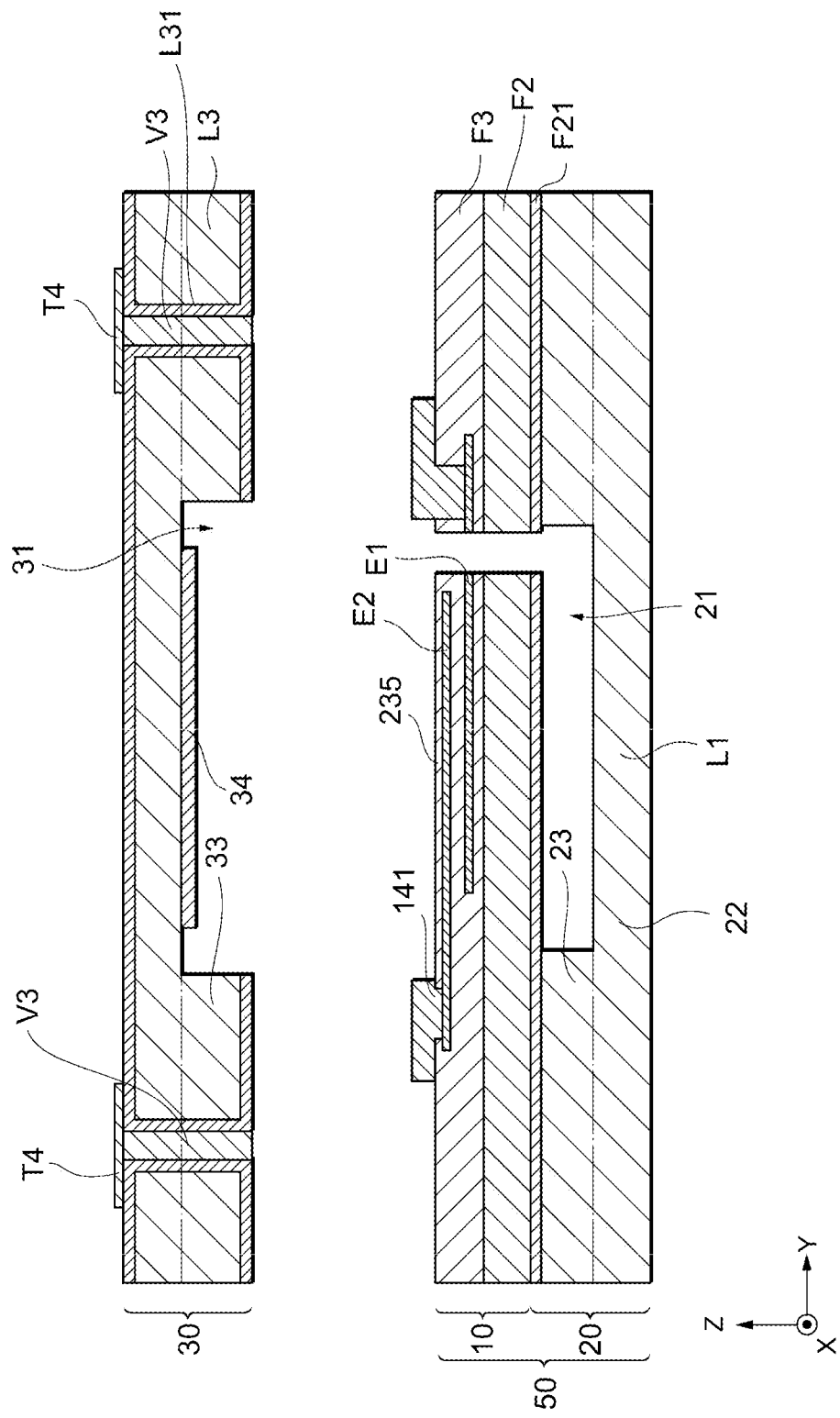
FIG. 6A is a schematic view illustrating a production process of a resonance device according to an embodiment.
Figure 6B:
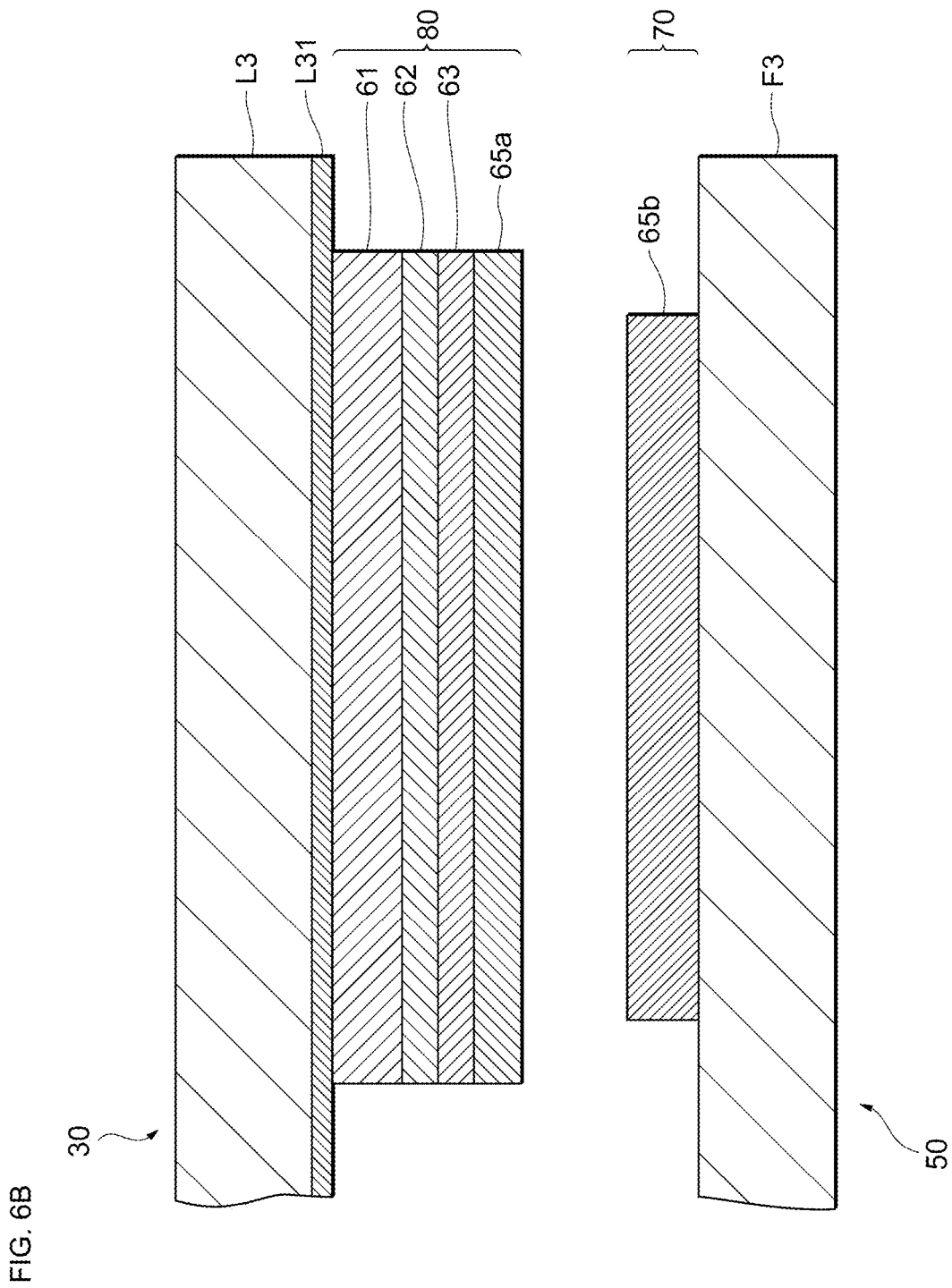
FIG. 6B is a schematic view illustrating the production process of a resonance device according to an embodiment.
Figure 6C:
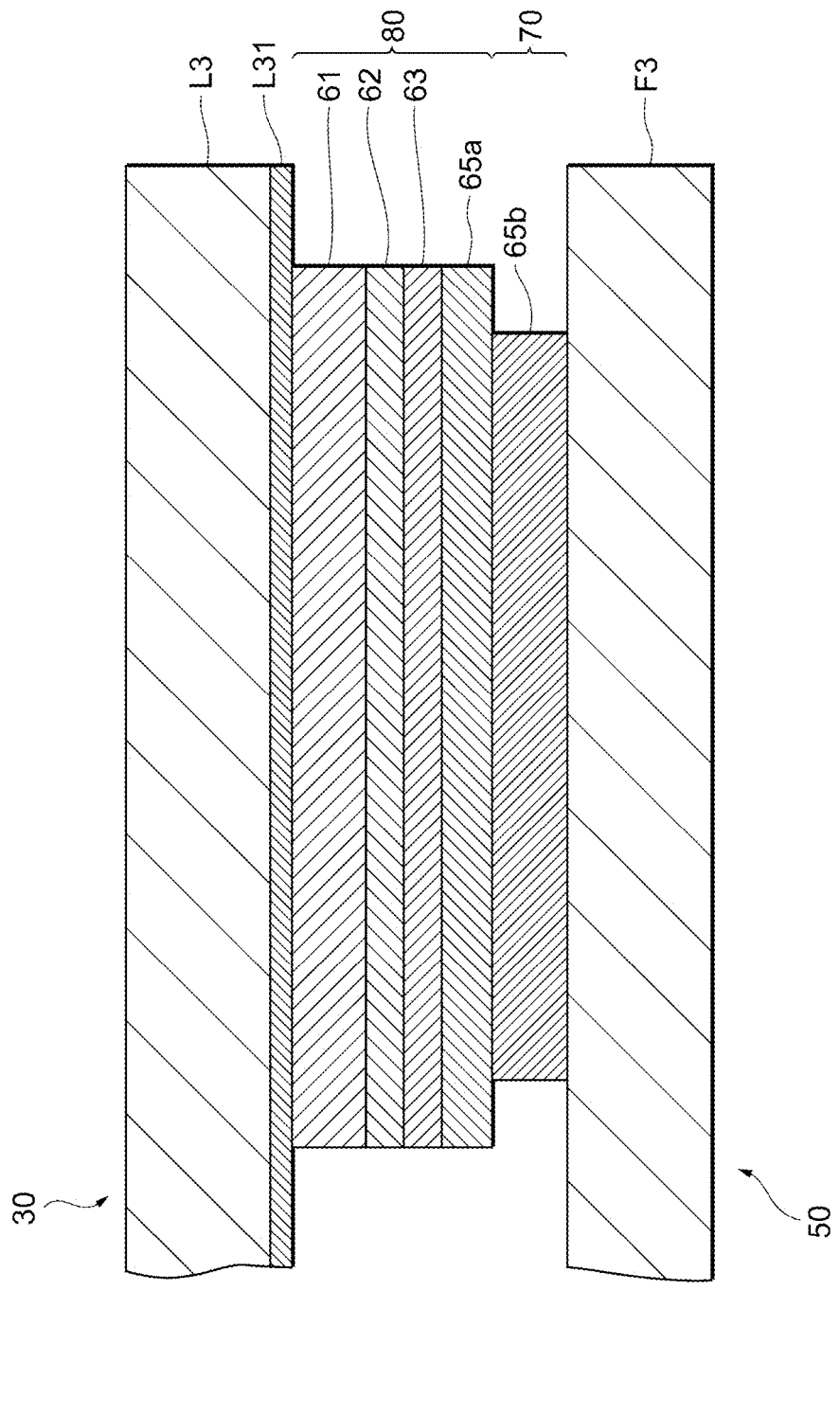
FIG. 6C is a schematic view illustrating the production process of a resonance device according to an embodiment.

A production process of the resonance device 1 according to an embodiment will be described below with reference to FIGS. 6A to 6C. FIGS. 6A to 6C are schematic views illustrating the production process of the resonance device 1 according to an embodiment. In the production process of the resonance device 1, a procedure for bonding the MEMS substrate 50 to the upper cover 30 will be selected and described. In FIGS. 6A to 6C, for the sake of convenience, one resonance device 1 of the multiple resonance devices 1 formed on or in a wafer is illustrated and described. As with normal MEMS processes, the resonance device 1 is obtained by forming multiple resonance devices on or in one wafer and then separating the wafer.

In a step illustrated in FIG. 6A, the MEMS substrate 50 including the resonator 10 and the upper cover 30 described above are provided.

In a step illustrated in FIG. 6B, the first layer 70 including the metal layer 65b mainly containing aluminum (Al) is formed around the vibrating portion 120 of the resonator 10 of the provided MEMS substrate 50.

Specifically, for example, aluminum (Al) is stacked on the piezoelectric thin film F3 of the resonator 10. Then the stacked aluminum (Al) is formed into a desired shape by, for example, etching, thereby forming the metal layer 65b outside the vibrating portion 120 of the MEMS substrate 50. The metal layer 65b is formed around the resonant space of the resonator 10 when the MEMS substrate 50 is viewed in a plan view thereof.

After the formation of the first layer 70, the MEMS substrate 50 is subjected to heat treatment for degassing at a high temperature, for example, about 435° C. Since the first layer 70 includes the metal layer 65b alone, the effect of thermal diffusion is small.

The second layer 80 including the first conductive layer 61, the first aluminum oxide film 62, the first titanium (Ti) layer 63, and the germanium (Ge) layer 65a consecutively arranged from the upper cover 30 is formed on the provided upper cover 30.

Specifically, for example, aluminum (Al) is stacked on a surface of the silicon oxide film L31 on the back surface of the upper cover 30. Then the stacked aluminum (Al) is formed into a desired shape by, for example, etching, thereby forming the first conductive layer 61 at a predetermined portion of the upper cover 30. The predetermined portion where the first conductive layer 61 is formed is, for example, a portion of the back surface of the upper cover 30 that faces or substantially faces the first layer 70 formed on the surface of the MEMS substrate 50 when the surface of the MEMS substrate 50 faces the back surface of the upper cover 30. Then the first aluminum oxide film 62 is formed on the first conductive layer 61 (below the first conductive layer 61 in FIG. 6B). Titanium (Ti) is stacked on the first aluminum oxide film 62 (below the first aluminum oxide film 62 in FIG. 6B) to provide the first titanium (Ti) layer 63. Furthermore, germanium (Ge) is stacked on the first titanium (Ti) layer 63 (below the first titanium (Ti) layer 63 in FIG. 6B) to provide the germanium (Ge) layer 65a.

After the formation of the second layer 80, the upper cover 30 is subjected to heat treatment for degassing at a high temperature, for example, about 435° C. This enables a sufficient release (evaporation) of a gas contained in the upper cover 30 and the second layer 80, thereby reducing the occurrence of outgassing.

In a step illustrated in FIG. 6C, the metal layer 65b of the first layer 70 is bonded to the germanium (Ge) layer 65a of the second layer 80 by eutectic bonding.

Specifically, the MEMS substrate 50 and the upper cover 30 are aligned in such a manner that the first layer 70 is matched to the second layer 80. After the alignment, the MEMS substrate 50 and the upper cover 30 are sandwiched by, for example, a heater and subjected to heat treatment for eutectic bonding. At this time, the upper cover 30 is moved toward the MEMS substrate 50. Thus, as illustrated in FIG. 6C, the germanium (Ge) layer 65a of the second layer 80 comes into contact with the metal layer 65b of the first layer 70.

The temperature in the heat treatment for eutectic bonding is preferably equal to or higher than a eutectic temperature and lower than the melting point of aluminum (Al) alone, i.e., about 424° C. or higher and about lower than 620° C. The heating time is preferably about 10 minutes to 20 minutes. In this embodiment, the heat treatment is performed at a temperature of 430° C. to 500° C. for about 15 minutes.

The resonance device 1 is pressed from the upper cover 30 to the MEMS substrate 50 at a pressure of, for example, about 15 MPa during the heating. The pressure applied is preferably about 5 MPa to about 25 MPa.

After the heat treatment for eutectic bonding, cooling treatment is performed, for example, by natural cooling. The cooling treatment is not limited to natural cooling. It is sufficient that the eutectic layer 65 can be formed at the bonding portion 60. Various cooling temperatures and various cooling rates can be selected.

Performing the step illustrated in FIG. 6C results in the formation of the bonding portion 60 including the eutectic layer 65 obtained by eutectic bonding between the germanium (Ge) layer 65a and the metal layer 65b mainly containing aluminum (Al) as illustrated in FIG. 5.

When the first layer 70 and the second layer 80 are formed, an aluminum (Al) film and a germanium (Ge) film may be formed and bonded together by eutectic bonding to form the connecting lines W1 configured to connect the through vias V3 to the respective voltage application portions 141 as illustrated in FIG. 4.

In this embodiment, the bonding portion 60 including the eutectic layer 65, the first titanium (Ti) layer 63, the first aluminum oxide film 62, and the first conductive layer 61 has been exemplified from FIG. 5 to FIG. 6C, but is not limited thereto.

(First Modification)

Figure 7:
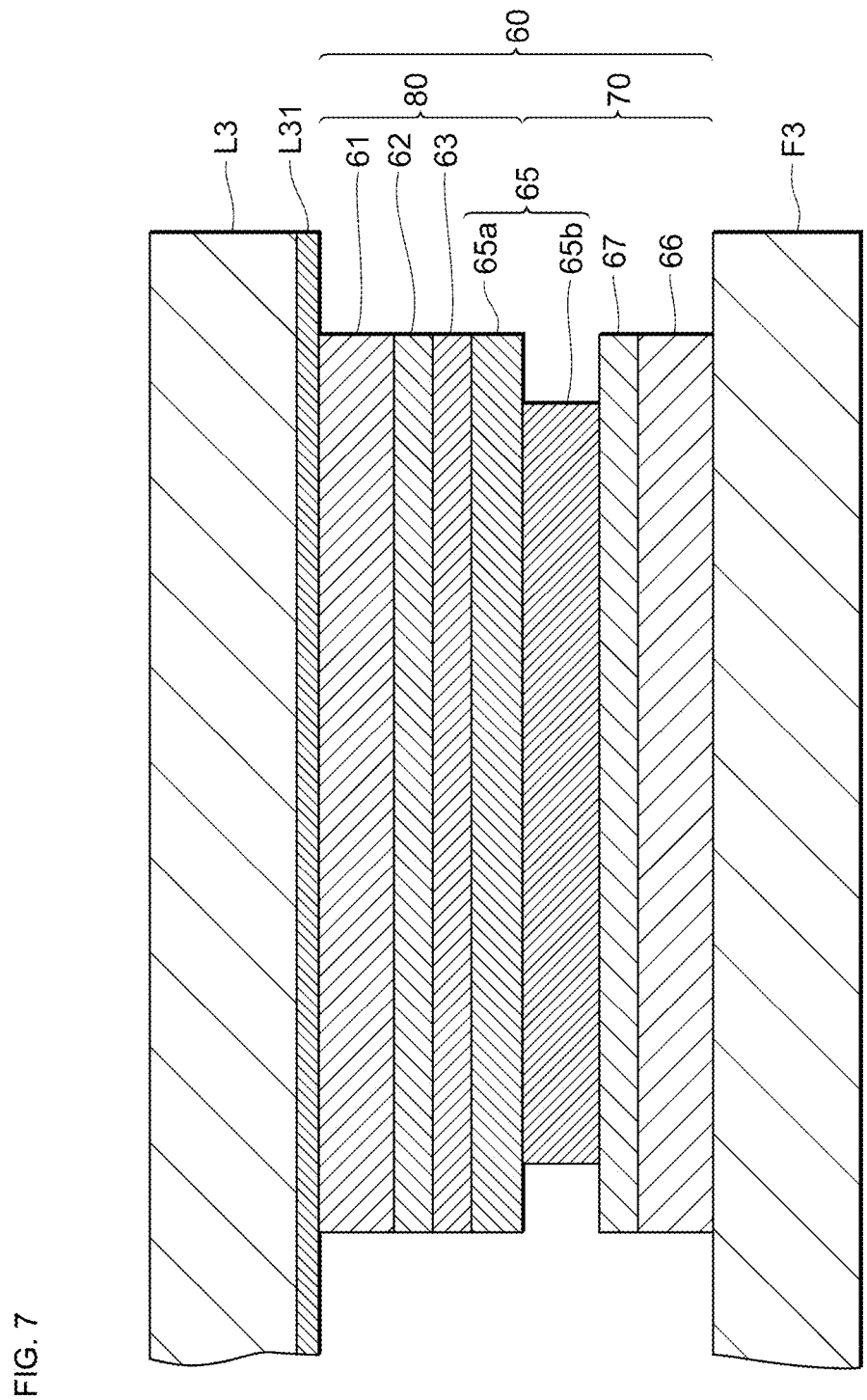
FIG. 7 is an enlarged fragmentary cross-sectional view of a first modification of the bonding portion illustrated in FIG. 5.

FIG. 7 is an enlarged fragmentary view of a first modification of the bonding portion 60 illustrated in FIG. 5. In a second modification, the same configuration as that of the bonding portion 60 illustrated in FIG. 5 are designated using the same reference numerals, and the description is omitted as appropriate. No mention will be made of the same operation and effect of the same configuration.

As illustrated in FIG. 7, the bonding portion 60 further includes a second conductive layer 66 and a second titanium (Ti) layer 67 consecutively arranged from the MEMS substrate 50 to the eutectic layer 65. The second conductive layer 66 and the second titanium (Ti) layer 67 are included in the first layer 70.

The second conductive layer 66 is disposed on the piezoelectric thin film F3 of the resonator 10. The material of the second conductive layer 66 is preferably aluminum (Al), an aluminum-copper alloy (AlCu alloy), or an aluminum-silicon-copper alloy (AlSiCu alloy). When the second conductive layer 66 is composed of an aluminum-copper alloy (AlCu alloy), copper (Cu) is preferably contained in an amount of about 0.5% by weight. In this case, the second conductive layer 66 is electrically conductive, the production process can be simplified, and the bonding portion 60 that seals the vibration space of the resonator 10 can be easily formed.

The second titanium (Ti) layer 67 is disposed on the second conductive layer 66. The second titanium (Ti) layer 67 is composed of titanium (Ti). The second titanium (Ti) layer 67 functions as a close-contact layer for providing close contact between the eutectic layer 65 and the second titanium (Ti) layer 67. Since the bonding portion 60 includes the second titanium (Ti) layer 67 and the eutectic layer 65 arranged consecutively, the eutectic layer 65 can spread over the second titanium (Ti) layer 67 to suppress the possible formation of voids between the eutectic layer 65 and the second titanium (Ti) layer 67. Accordingly, the bonding portion 60 can further enhance the airtightness of the vibration space of the resonator 10.

As described above, since the bonding portion 60 includes the second conductive layer 66 and the second titanium (Ti) layer 67 consecutively arranged from the MEMS substrate 50 to the eutectic layer 65, wiring can be routed from the second conductive layer 66 at the MEMS substrate 50.

In the production process according to the first modification, the second conductive layer 66 and the second titanium (Ti) layer 67 are continuously formed from the MEMS substrate 50 side to the metal layer 65b in the step of forming the first layer 70.

Specifically, for example, aluminum (Al) is stacked on the piezoelectric thin film F3 of the resonator 10. Then the stacked aluminum (Al) is formed into a desired shape by, for example, etching, thereby forming the second conductive layer 66. The second conductive layer 66 is formed around the resonant space of the resonator 10 when the MEMS substrate 50 is viewed in the plan view thereof. Titanium (Ti) is stacked on the second conductive layer 66 to form the second titanium (Ti) layer 67. Furthermore, for example, aluminum (Al) is stacked on the second titanium (Ti) layer 67 to form the metal layer 65b. Similar to the step illustrated in FIG. 6C, the metal layer 65b and the germanium (Ge) layer 65a are bonded together by eutectic bonding; thus, the bonding portion 60 includes the second conductive layer 66, the second titanium (Ti) layer 67, and the eutectic layer 65 arranged consecutively.

(Second Modification)

Figure 8:
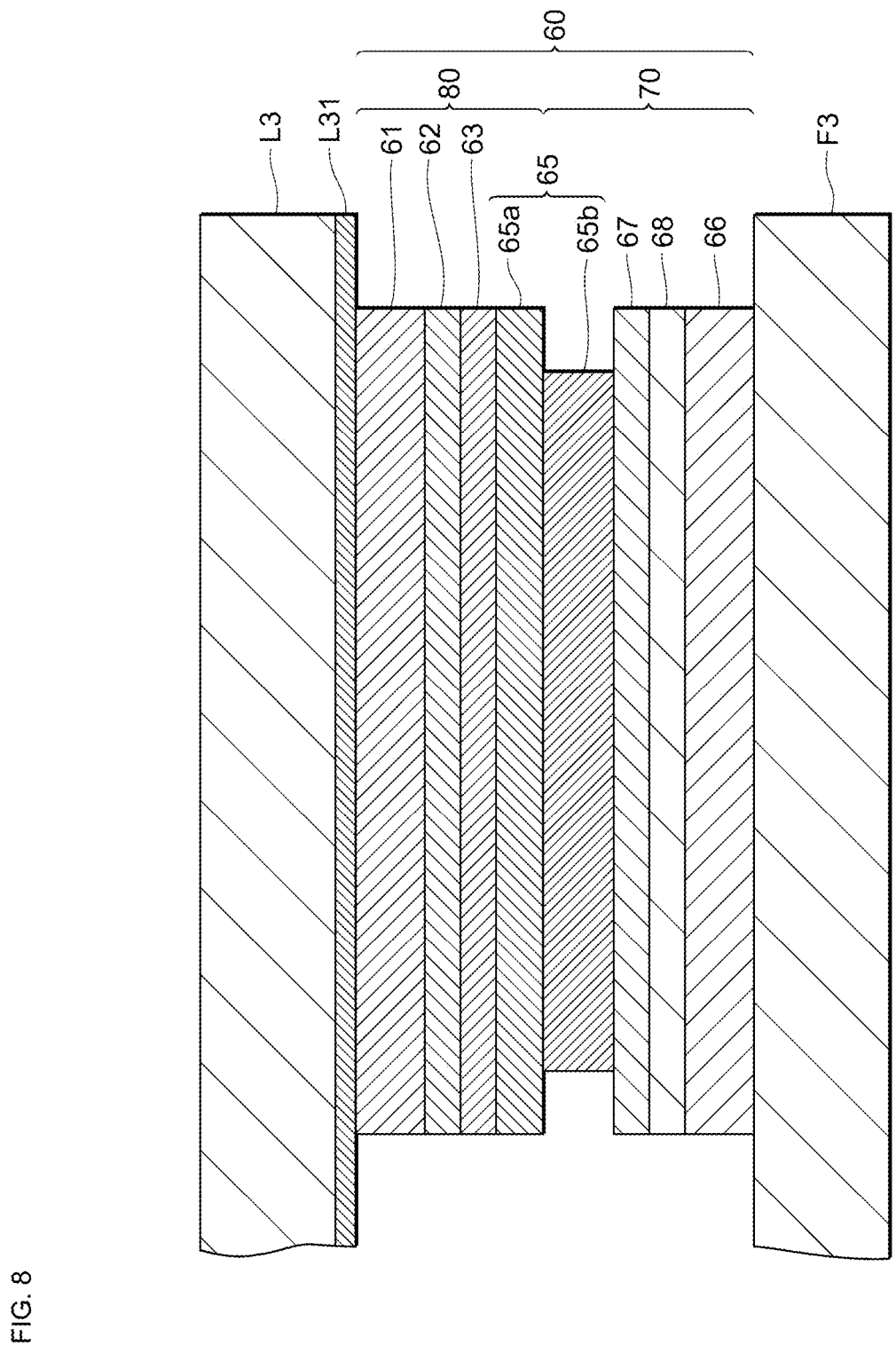
FIG. 8 is an enlarged fragmentary cross-sectional view of a second modification of the bonding portion illustrated in FIG. 5.

FIG. 8 is an enlarged fragmentary view of a second modification of the bonding portion 60 illustrated in FIG. 5. In the second modification, the same configuration as that of the bonding portion 60 illustrated in FIG. 5 are designated using the same reference numerals, and the description is omitted as appropriate. No mention will be made of the same operation and effect of the same configuration.

As illustrated in FIG. 8, the bonding portion 60 further includes the second conductive layer 66, a second aluminum oxide film 68, and the second titanium (Ti) layer 67 consecutively arranged from the MEMS substrate 50 to the eutectic layer 65. The second conductive layer 66, the second aluminum oxide film 68, and the second titanium (Ti) layer 67 are included in the first layer 70.

The second conductive layer 66 is disposed on the piezoelectric thin film F3 of the resonator 10. As with the first modification, the material of the second conductive layer 66 is preferably aluminum (Al), an aluminum-copper alloy (AlCu alloy), or an aluminum-silicon-copper alloy (AlSiCu alloy).

The second aluminum oxide film 68 is disposed on the second conductive layer 66. The second aluminum oxide film 68 is composed of aluminum oxide. The second aluminum oxide film 68 is formed on the second conductive layer 66 by exposing a surface of the second conductive layer 66 to an oxygen plasma or air. When the surface of the second conductive layer 66 is exposed to air, the second aluminum oxide film 68 has a thickness of about 5 nm. The second aluminum oxide film 68 preferably has a thickness of 3 nm to 10 nm. In this case, it is possible to suppress an increase in resistance to conduction due to the second aluminum oxide film 68.

The second titanium (Ti) layer 67 is disposed on the second aluminum oxide film 68. The second titanium (Ti) layer 67 is composed of titanium (Ti). As with the first modification, the second titanium (Ti) layer 67 functions as a close-contact layer for providing close contact between the eutectic layer 65 and the second titanium (Ti) layer 67.

Furthermore, the second aluminum oxide film 68 and the second titanium (Ti) layer 67 function as diffusion-preventing layers for preventing thermal diffusion.

To verify the function as the diffusion-preventing layers, the MEMS substrate 50 on which the first layer 70 including the second conductive layer 66, the second aluminum oxide film 68, the second titanium (Ti) layer 67, and the metal layer 65b was disposed was subjected to heat treatment for degassing at 435° C. The results indicated that in the first layer 70 after the heat treatment, no migration of aluminum or an aluminum alloy of the second conductive layer 66 due to thermal diffusion was observed.

For comparison with the first layer 70 according to the second modification, a first layer that does not contain the second aluminum oxide film 68, specifically, a MEMS substrate on which a virtual first layer including a conductive layer composed of aluminum (Al), a titanium (Ti) layer, and a metal layer composed of aluminum (Al) were consecutively arranged in this order, was subjected to heat treatment for degassing at 360° C. In the virtual first layer after the heat treatment, aluminum (Al) in the conductive layer diffused to the metal layer through the titanium (Ti) layer. This thermal diffusion causes a deviation of a eutectic composition and the failure of a eutectic reaction during eutectic bonding.

As described above, since the bonding portion 60 includes the second conductive layer 66, the second aluminum oxide film 68, and the second titanium (Ti) layer 67 consecutively arranged from the MEMS substrate 50 to the eutectic layer 65, wiring can be routed from the second conductive layer 66 at the MEMS substrate 50. Furthermore, the thermal diffusion between the aluminum oxide film and titanium (Ti) is less likely to occur; thus, the MEMS substrate 50 can be subjected to heat treatment for degassing at a high temperature.

In the production process according to the second modification, the second conductive layer 66, the second aluminum oxide film 68, and the second titanium (Ti) layer 67 are consecutively arranged from the MEMS substrate 50 to the metal layer 65b in the step of forming the first layer 70.

Specifically, for example, aluminum (Al) is stacked on the piezoelectric thin film F3 of the resonator 10. Then the stacked aluminum (Al) is formed into a desired shape by, for example, etching, thereby forming the second conductive layer 66. The second conductive layer 66 is formed around the resonant space of the resonator 10 when the MEMS substrate 50 is viewed in plan. The second aluminum oxide film 68 is formed on the second conductive layer 66. Titanium (Ti) is stacked on the second aluminum oxide film 68 to form the second titanium (Ti) layer 67. Furthermore, for example, aluminum (Al) is stacked on the second titanium (Ti) layer 67 to form the metal layer 65b. Similar to the step illustrated in FIG. 6C, the metal layer 65b, and the germanium (Ge) layer 65a are bonded together by eutectic bonding; thus, the bonding portion 60 includes the second conductive layer 66, the second aluminum oxide film 68, the second titanium (Ti) layer 67, and the eutectic layer 65 arranged consecutively.

The exemplary embodiments of the present invention have been described above. The resonance device 1 according to an embodiment of the present invention includes the MEMS substrate 50 including the resonator 10, the upper cover 30, and the bonding portion 60 that bonds the MEMS substrate 50 to the upper cover 30 so as to seal the vibration space of the resonator 10. The bonding portion 60 includes the eutectic layer 65 composed of a eutectic alloy of germanium (Ge) and a metal mainly containing aluminum (Al), the first titanium (Ti) layer 63, the first aluminum oxide film 62, and the first conductive layer 61 consecutively arranged from the MEMS substrate 50 to the upper cover 30. Titanium (Ti) has excellent wettability with the eutectic alloy of germanium (Ge) and the metal mainly containing aluminum (Al) obtained by eutectic bonding. Since the bonding portion 60 includes the eutectic layer 65 and the first titanium (Ti) layer 63 arranged consecutively, the eutectic layer 65 can spread over the first titanium (Ti) layer 63 to suppress the possible formation of voids between the eutectic layer 65 and the first titanium (Ti) layer 63. Accordingly, the airtightness of the vibration space of the resonator 10 can be enhanced. Additionally, titanium (Ti) has the feature that the material cost is low, compared with, for example, tantalum (Ta) and tantalum nitride (TaN). Since the bonding portion 60 includes the first titanium (Ti) layer 63, it is possible to reduce the production cost of the bonding portion 60. Furthermore, since the bonding portion 60 includes the first titanium (Ti) layer 63 and the first aluminum oxide film 62 arranged consecutively, the thermal diffusion between the aluminum oxide film and titanium (Ti) is less likely to occur; thus, it is possible to raise the temperature of the heat treatment for degassing.

Accordingly, a gas contained in the resonance device 1 can be released (evaporated) by high-temperature heat treatment to suppress the occurrence of outgassing, thereby providing a high vacuum in the vibration space of the resonator 10.

In the resonance device 1 described above, the first aluminum oxide film 62 may have a thickness of 3 nm to 10 nm. It is thus possible to suppress an increase in resistance to conduction due to the first aluminum oxide film 62.

In the resonance device 1 described above, the material of the first conductive layer 61 may be aluminum (Al), an aluminum-copper alloy (AlCu alloy), or an aluminum-silicon-copper alloy (AlSiCu alloy). Aluminum or an aluminum alloy is a metal that is often used for, for example, lines in resonance devices and so forth. In the case where aluminum (Al), an aluminum-copper alloy (AlCu alloy), or an aluminum-silicon-copper alloy (AlSiCu alloy) is used for the first conductive layer 61, the first conductive layer 61 is electrically conductive, the production process can be simplified, and the bonding portion 60 that seals the vibration space of the resonator 10 can be easily formed.

In the resonance device 1 described above, the metal mainly containing aluminum may be aluminum (Al), an aluminum-copper alloy (AlCu alloy), or an aluminum-silicon-copper alloy (AlSiCu alloy). In this case, the germanium (Ge) layer 65a and the metal layer 65b can be easily bonded together by eutectic bonding, the production process can be simplified, and the bonding portion 60 that seals the vibration space of the resonator 10 can be easily formed.

In the resonance device 1 described above, the bonding portion 60 may further include the second conductive layer 66 and the second titanium (Ti) layer 67 consecutively arranged from the MEMS substrate 50 to the eutectic layer 65. In the case where the bonding portion 60 includes the second titanium (Ti) layer 67 and the eutectic layer 65 arranged consecutively, the eutectic layer 65 can spread over the second titanium (Ti) layer 67 to suppress the possible formation of voids between the eutectic layer 65 and the second titanium (Ti) layer 67. Accordingly, the bonding portion 60 can further enhance the airtightness of the vibration space of the resonator 10. Additionally, in the case where the bonding portion 60 includes the second conductive layer 66 and the second titanium (Ti) layer 67 consecutively arranged from the MEMS substrate 50 to the eutectic layer 65, wiring can be routed from the second conductive layer 66 at the upper cover 30.

In the resonance device 1 described above, the bonding portion 60 may further include the second conductive layer 66, the second aluminum oxide film 68, and the second titanium (Ti) layer 67 consecutively arranged from the MEMS substrate 50 to the eutectic layer 65. In the case where the bonding portion 60 includes the second conductive layer 66, the second aluminum oxide film 68, and the second titanium (Ti) layer 67 consecutively arranged from the MEMS substrate 50 to the eutectic layer 65, wiring can be routed from the second conductive layer 66 at the MEMS substrate 50. Furthermore, the thermal diffusion between the aluminum oxide film and titanium (Ti) is less likely to occur; thus, the MEMS substrate 50 can be subjected to heat treatment for degassing at a high temperature.

In the resonance device 1 described above, the second aluminum oxide film 68 may have a thickness of 3 nm to 10 nm. In this case, it is possible to suppress an increase in resistance to conduction due to the second aluminum oxide film 68.

In the resonance device 1 described above, the material of the second conductive layer 66 may be aluminum (Al), an aluminum-copper alloy (AlCu alloy), or an aluminum-silicon-copper alloy (AlSiCu alloy). In this case, the second conductive layer 66 is electrically conductive, and the bonding portion 60 that seals the vibration space of the resonator 10 can be easily formed.

A method for producing a resonance device according to an embodiment of the present invention includes forming the first layer 70 including the metal layer 65b mainly containing aluminum (Al) around the vibrating portion 120 of the resonator 10 of the MEMS substrate 50, forming the second layer 80 on a portion of the upper cover 30 that faces the first layer 70 when the MEMS substrate 50 faces the upper cover 30, the second layer 80 including the first conductive layer 61, the first aluminum oxide film 62, the first titanium (Ti) layer 63, and the germanium (Ge) layer 65a consecutively formed in this order from the upper cover 30, and bonding the metal layer 65b of the first layer 70 to the germanium (Ge) layer 65a of the second layer 80 by eutectic bonding so as to seal the vibration space of the resonator 10. Thereby, the bonding portion 60 including the eutectic layer 65 obtained by eutectic bonding between the metal layer 65b mainly containing aluminum (Al) and the germanium (Ge) layer 65a is formed. Since the bonding portion 60 includes the first titanium (Ti) layer 63 and eutectic layer 65 formed consecutively, the eutectic layer 65 can spread over the first titanium (Ti) layer 63 to suppress the possible formation of voids between the eutectic layer 65 and the first titanium (Ti) layer 63. Accordingly, the airtightness of the vibration space of the resonator 10 can be enhanced. Since the bonding portion 60 includes the first titanium (Ti) layer 63, it is possible to reduce the production cost of the bonding portion 60. Furthermore, since the bonding portion 60 includes the first aluminum oxide film 62 and the first titanium (Ti) layer 63 consecutively formed, the thermal diffusion between the aluminum oxide film and titanium (Ti) is less likely to occur; thus, it is possible to raise the temperature of the heat treatment for degassing. Accordingly, a gas contained in the resonance device 1 can be released (evaporated) by high-temperature heat treatment to suppress the occurrence of outgassing, thereby providing a high vacuum in the vibration space of the resonator 10.

In the foregoing method for producing a resonance device, the first aluminum oxide film 62 may have a thickness of 3 nm to 10 nm. In this case, it is possible to suppress an increase in resistance to conduction due to the first aluminum oxide film 62.

In the foregoing method for producing a resonance device, the material of the first conductive layer 61 may be aluminum (Al), an aluminum-copper alloy (AlCu alloy), or an aluminum-silicon-copper alloy (AlSiCu alloy). In this case, the first conductive layer 61 is electrically conductive, the production process can be simplified, and the bonding portion 60 that seals the vibration space of the resonator 10 can be easily formed.

In the foregoing method for producing a resonance device, the material of the metal layer 65b may be aluminum (Al), an aluminum-copper alloy (AlCu alloy), or an aluminum-silicon-copper alloy (AlSiCu alloy). In this case, the germanium (Ge) layer 65a can be easily bonded to the metal layer 65b by eutectic bonding, the production process can be simplified, and the bonding portion 60 that seals the vibration space of the resonator 10 can be easily formed.

In the foregoing method for producing a resonance device, the forming of the first layer 70 may further include consecutively forming the second conductive layer 66 and the second titanium (Ti) layer 67 from the MEMS substrate 50 to the metal layer 65b. Since the bonding portion 60 includes the second titanium (Ti) layer 67 and the eutectic layer 65 formed consecutively, the eutectic layer 65 can spread over the second titanium (Ti) layer 67 to suppress the possible formation of voids between the eutectic layer 65 and the second titanium (Ti) layer 67. Accordingly, the bonding portion 60 can further enhance the airtightness of the vibration space of the resonator 10. Furthermore, since the bonding portion 60 includes the second conductive layer 66 and the second titanium (Ti) layer 67 consecutively formed from the MEMS substrate 50 to the eutectic layer 65, wiring can be routed from the second conductive layer 66 at the MEMS substrate 50.

In the foregoing method for producing a resonance device, the forming of the first layer 70 may further include consecutively forming the second conductive layer 66, the second aluminum oxide film 68, and the second titanium (Ti) layer 67 from the MEMS substrate 50 to the metal layer 65b. Since the bonding portion 60 includes the second conductive layer 66, the second aluminum oxide film 68, and the second titanium (Ti) layer 67 consecutively formed from the MEMS substrate 50 to the eutectic layer 65, wiring can be routed from the second conductive layer 66 at the MEMS substrate 50. Furthermore, the thermal diffusion between the aluminum oxide film and titanium (Ti) is less likely to occur; thus, the MEMS substrate 50 can be subjected to heat treatment for degassing at a high temperature.

In the foregoing method for producing a resonance device, the second aluminum oxide film 68 may have a thickness of 3 nm to 10 nm. In this case, it is possible to suppress an increase in resistance to conduction due to the second aluminum oxide film 68.

In the foregoing method for producing a resonance device, the material of the second conductive layer 66 may be aluminum (Al), an aluminum-copper alloy (AlCu alloy), or an aluminum-silicon-copper alloy (AlSiCu alloy). In this case, the second conductive layer 66 is electrically conductive, the production process can be simplified, and the bonding portion 60 that seals the vibration space of the resonator 10 can be easily formed.

It is noted that the embodiments have been described above for ease of understanding of the present invention and are not intended to limit the scope of the present invention. Changes and improvements may be made to the present invention within the scope of the invention, and the present invention includes equivalents thereof. In other words, design changes may be suitably made to the embodiments by those skilled in the art, and such embodiments are also within the scope of the present invention as long as they have the features of the present invention. For example, the elements included in the embodiments and the arrangements, materials, conditions, shapes, sizes, and the like of the elements are not limited to those described above as examples, and they may be suitably changed. The embodiments are exemplary embodiments, and configurations described in the different embodiments can be partially replaced or combined and are also included in the scope of the present invention as long as the configurations include the features of the present invention.

REFERENCE SIGNS LIST 1 resonance device
10 resonator
20 lower cover
21 recessed portion
22 base plate
23 side wall
30 upper cover
31 recessed portion 33 side wall
34 gettering layer
50 MEMS substrate
60 bonding portion
61 first conductive layer
62 first aluminum oxide film
63 first titanium (Ti) layer
65 eutectic layer
65a germanium (Ge) layer
65b metal layer
66 second conductive layer
67 second titanium (Ti) layer
68 second aluminum oxide film
70 first layer
80 second layer
110 holding arm
120 vibrating portion
130 base portion
135, 135A, 135B, 135C, 135D vibrating arm
140 holding portion
141 voltage application portions
235 protective film
E1, E2 metal layer
F2 Si substrate
F3 piezoelectric thin film
F21 silicon oxide layer
L1 Si wafer
L3 Si wafer
L31 silicon oxide film
T4 terminal
V3 through via
W1 connecting line

The invention claimed is:

1. A resonance device, comprising:
a first substrate including a resonator;
a second substrate; and
a bonding portion bonding the first substrate to the second substrate so as to seal a vibration space of the resonator, wherein the bonding portion includes a eutectic layer composed of a eutectic alloy of germanium and a metal mainly containing aluminum, a first titanium layer, a first aluminum oxide film, and a first conductive layer consecutively arranged from the first substrate to the second substrate.

2. The resonance device according to claim 1, wherein the first aluminum oxide film has a thickness of 3 nm to 10 nm.

3. The resonance device according to claim 1, wherein a material of the first conductive layer is aluminum, an aluminum-copper alloy, or an aluminum-silicon-copper alloy.

4. The resonance device according to claim 1, wherein the metal mainly containing aluminum is aluminum, an aluminum-copper alloy, or an aluminum-silicon-copper alloy.

5. The resonance device according to claim 1, wherein the bonding portion further includes a second conductive layer and a second titanium layer consecutively arranged from the first substrate to the eutectic layer.

6. The resonance device according to claim 5, wherein a material of the first conductive layer is aluminum, an aluminum-copper alloy, or an aluminum-silicon-copper alloy.

7. The resonance device according to claim 5, wherein the metal mainly containing aluminum is aluminum, an aluminum-copper alloy, or an aluminum-silicon-copper alloy.

8. The resonance device according to claim 5, wherein a material of the second conductive layer is aluminum, an aluminum-copper alloy, or an aluminum-silicon-copper alloy.

9. The resonance device according to claim 1, wherein the bonding portion further includes a second conductive layer, a second aluminum oxide film, and a second titanium layer consecutively arranged from the first substrate to the eutectic layer.

10. The resonance device according to claim 9, wherein the second aluminum oxide film has a thickness of 3 nm to 10 nm.

11. The resonance device according to claim 9, wherein a material of the first conductive layer is aluminum, an aluminum-copper alloy, or an aluminum-silicon-copper alloy.

12. The resonance device according to claim 9, wherein the metal mainly containing aluminum is aluminum, an aluminum-copper alloy, or an aluminum-silicon-copper alloy.

13. The resonance device according to claim 9, wherein a material of the second conductive layer is aluminum, an aluminum-copper alloy, or an aluminum-silicon-copper alloy.

14. A method for producing a resonance device, the method comprising:
forming a first layer including a metal layer mainly containing aluminum around a vibrating portion of a resonator of a first substrate;
forming a second layer on a portion of a second substrate that faces the first layer when the first substrate faces the second substrate, the second layer including a first conductive layer, a first aluminum oxide film, a first titanium layer, and a germanium layer consecutively formed in this order from the second substrate; and
bonding the metal layer of the first layer to the germanium layer of the second layer by eutectic bonding so as to seal a vibration space of the resonator.

15. The method for producing a resonance device according to claim 14, wherein the first aluminum oxide film is formed to have a thickness of 3 nm to 10 nm.

16. The method for producing a resonance device according to claim 14, wherein a material of the first conductive layer is aluminum, an aluminum-copper alloy, or an aluminum-silicon-copper alloy.

17. The method for producing a resonance device according to claim 14, wherein a material of the metal layer is aluminum, an aluminum-copper alloy, or an aluminum-silicon-copper alloy.

18. The method for producing a resonance device according to claim 14, wherein the forming of the first layer further includes consecutively forming a second conductive layer and a second titanium layer from the first substrate lies to the metal layer.

19. The method for producing a resonance device according to claim 14, wherein the forming of the first layer further includes consecutively forming a second conductive layer, a second aluminum oxide film, and a second titanium layer from the first substrate to the metal layer.

20. The method for producing a resonance device according to claim 18, wherein a material of the second conductive layer is aluminum, an aluminum-copper alloy, or an aluminum-silicon-copper alloy.

* * * * *